United States Patent
Shiba

(10) Patent No.: US 6,236,066 B1
(45) Date of Patent: May 22, 2001

(54) LIGHT EMITTING ELEMENT WITH ELECTRODE WINDOW

(75) Inventor: Shigemitsu Shiba, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/276,510

(22) Filed: Mar. 25, 1999

(30) Foreign Application Priority Data

Mar. 26, 1998 (JP) .................................................. 10-079355

(51) Int. Cl.[7] ..................................................... H01L 33/00
(52) U.S. Cl. ............................................... 257/99; 372/45
(58) Field of Search ................................ 257/99; 372/45

(56) References Cited

U.S. PATENT DOCUMENTS 4,214,251 * 7/1980 Schairer .................................. 357/17
4,979,002 * 12/1990 Pankove ................................. 357/17
5,386,139 * 1/1995 Idei et al. ............................. 257/466

* cited by examiner

Primary Examiner—Jerome Jackson, Jr.
Assistant Examiner—B. W. Baumeister
(74) Attorney, Agent, or Firm—Fitzpatrick, Cella, Harper & Scinto

(57) ABSTRACT

A light emitting element includes a light emitting portion emitting light by the supply of electric power thereto, an enclosing portion having electrical conductivity and having the light emitting portion enclosed therein, first and second electrode layers formed on the two opposed surfaces of the enclosing portion and to which electric power for causing the light emitting portion to emit light is supplied, and an opening hole formed in at least one of the first and second electrode layers and permitting the light emitting portion to be observed through the enclosing portion from a direction which is not affected by a beam emitted from the light emitting portion. The specification also discloses a method of manufacturing such a light emitting element.

5 Claims, 3 Drawing Sheets

LIGHT EMITTING ELEMENT WITH ELECTRODE WINDOW

BACKGROUND OF THE INVENTION

1. Field of the Invention

This invention relates to a light emitting element and a method of manufacturing the same.

2. Related Background Art

Various kinds of light emitting elements have heretofore been utilized in various kinds of optical apparatuses; for example, in a printer apparatus or the like for forming images by an electrophotographic method, a semiconductor laser is utilized as a light emitting element for exposure. The semiconductor laser is generally formed in a thin film laminated structure, and a laser beam is induced and emitted in a lengthwise direction from a rectangular parallelepipedic laser resonator (stripe).

Such a semiconductor laser will hereinafter be described as an example of the light emitting element according to the prior art with reference to FIGS. 1 and 2 of the accompanying drawings. FIG. 1 is a typical perspective view showing the appearances of the semiconductor laser, and FIG. 2 is a longitudinal cross-sectional view taken along the line 2—2 of FIG. 1. Herein, longitudinal, left to right and vertical directions will be referred to with reference to FIG. 1, but these are conveniently used to simplify the description.

The semiconductor laser 1 exemplified as a light emitting element is provided with a laser resonator (stripe) 2 as a rectangular parallelepipedic light emitting portion elongated in a longitudinal direction (front-rear direction), as shown, and this laser resonator (stripe) 2 is enclosed in laser diode chip 3 which is a rectangular parallelepipedic enclosing portion flat in a vertical direction.

First and second electrode layers 6 and 7 are formed on a cathode surface 4 and an anode surface 5, respectively, which are the two vertically opposed surfaces of the laser diode chip 3, and the first electrode layer 6 is connected to a stem 8, and the second electrode layer 7 has a bonding wire 9 connected thereto.

The laser resonator (stripe) 2 comprises, for example, GaAs or the like, and when electric power is supplied thereto in a vertical direction, it induces and emits a laser beam in a longitudinal direction which is a lengthwise direction. The laser diode chip 3 comprises, for example, GaAlAs or the like, and has electrical conductivity and a light transmitting property, and satisfactorily transmits a light beam, and is capable of direct radiation for satisfactorily observing an electron beam.

The first and second electrode layers 6 and 7 are formed of a metal such as Au, and electric power for causing the laser resonator (stripe) 2 to emit light is supplied thereto through the laser diode chip 3. The bonding wire 9 and the stem 8 are formed of a metal such as Au and supply electric power for causing the laser resonator (stripe) 2 to emit light to the electrode layers 6 and 7.

The semiconductor laser 1 of such structure as described above actually is disposed in a cylindrical package (not shown) by the stem 8, and a driving circuit (not shown) is connected to the stem 8 and the bonding wire 9 through the connection terminal or the like of the package.

When in such a state, electric power is supplied from the driving circuit to the first and second electrode layers 6 and 7 of the semiconductor laser 1 through the bonding wire 9 and the stem 8, this electric power is supplied to the laser resonator (stripe) 2 through the laser diode chip 3 and thus, this laser resonator (stripe) 2 induces and emits a laser beam in the forward direction, i.e., in a lengthwise direction.

The semiconductor laser 1 as described above induces and emits a laser beam from the laser resonator (stripe) 2 by supplying electric power to the first and second electrode layers 6 and 7.

However, the semiconductor laser 1 as described above may suffer from the occurrence of the destruction or abnormality of the crystal in the laser resonator (stripe) 2 due to electrical stress such as static electricity or an external serge voltage. Also, if the time for which the semiconductor laser 1 is used is accumulated, the destruction or abnormality of the crystal may occur in the laser resonator (stripe) 2.

So, when the semiconductor laser 1 is to be developed as a product, it is important to observe the state of the destruction or abnormality of the crystal of the laser resonator (stripe) 2 as described above and clear up the cause thereof and take an effective countermeasure. In this case, it is useful to actually supply electric power to the electrode layers 6 and 7 of the semiconductor laser 1 to thereby cause the laser resonator (stripe) 2 to emit light, and observe the dynamic state thereof by an optical microscope or an electronic microscope.

In the prior art semiconductor laser 1, however, the laser diode chip 3 enclosing the laser resonator (stripe) 2 therein physically transmits a light beam well and is capable of direct radiation, but the electrode layers 6 and 7 formed on the upper and lower surfaces do not satisfactorily transmit a visible ray of light or an electron beam. Therefore, it is difficult to observe the laser resonator (stripe) 2 emitting light from the outside of the semiconductor laser 1.

If, for example, the upper electrode layer 7 is peeled off, it is possible to observe the laser resonator (stripe) 2 from the outside by an optical microscope or an electronic microscope, but when the electrode layer 7 is peeled off, electric power cannot be supplied to the semiconductor laser 1 and therefore, the laser resonator (stripe) 2 emitting light cannot be dynamically observed.

In FIGS. 1 and 2, both sides of the laser diode chip 3 are opened, but these both sides are actually extremely narrow in width as compared with the upper and lower surfaces. In addition, each layer is laminated in a vertical direction, and therefore, it is actually difficult to observe the laser resonator (stripe) 2 from the sides of the laser diode chip 3.

SUMMARY OF THE INVENTION

The present invention has been made in view of the above-noted problems, and the object thereof is to provide a light emitting element permitting the light emitting state of the light emitting portion thereof to be easily observed and a method of manufacturing the same.

The light emitting element of the present invention is a light emitting element provided with a light emitting portion emitting light by the supply of electric power thereto, an enclosing portion having electrical conductivity and having the light emitting portion enclosed therein, and first and second electrode layers formed on the two opposed surfaces of the enclosing portion and to which electric power for causing the light emitting portion to emit light is supplied, at least one of the first and second electrode layers being formed with an opening hole permitting the light emitting portion to be observed through the enclosing portion from a direction which is not affected by a beam emitted from the light emitting portion.

Accordingly, in the light emitting element of the present invention, when electric power is supplied to the first and second electrode layers, this electric power is supplied to the light emitting portion through the enclosing portion, and therefore, this light emitting portion emits light. Since at least one of the first and second electrode layers is formed with an opening hole by which the light emitting portion can be observed through the enclosing portion from a direction which is not affected by the beam emitted from the light emitting portion, the light emitting portion emitting light is observed from the outside of the opening hole.

As another embodiment of the invention in the light emitting element as described above, the light emitting portion comprises a laser resonator (stripe) which induces and emits a laser beam in a direction orthogonal to a direction in which electric power is supplied. Accordingly, the light emitting portion comprising a laser resonator (stripe) induces and emits a laser beam in an orthogonal direction when electric power is supplied thereto, and therefore, this state is observed from a direction orthogonal to the direction of emission of the laser beam.

As another embodiment of the invention in the light emitting element as described above, the opening hole of the electrode layer is formed into a shape corresponding to the light emitting portion. Accordingly, since the opening hole of the electrode layer is formed into a shape corresponding to the light emitting portion, substantially the whole of the light emitting portion emitting light from this opening hole is observed, and the opening hole is not formed unnecessarily large in the electrode layer for supplying electric power.

As another embodiment of the invention in the light emitting element as described above, the light emitting portion is formed into a rectangular parallelepipedic shape emitting a ray of light in a lengthwise direction, and the opening hole is formed into a rectangular parallelepipedic shape. Accordingly, substantially the entire rectangular parallelepipedic light emitting portion emitting a ray of light in a lengthwise direction is observed from the opening hole formed in a rectangular parallelepipedic shape.

As another embodiment of the invention in the light emitting element as described above, the light emitting portion is formed in a rectangular parallelepipedic shape emitting a ray of light in the lengthwise direction thereof, and the opening hole comprises a plurality of small holes formed in series in the lengthwise direction of the light emitting portion. Accordingly, substantially the entire rectangular parallelepipedic light emitting portion emitting a ray of light in the lengthwise direction is observed from a series of a plurality of small holes in the lengthwise direction thereof.

As another embodiment of the invention in the light emitting element as described above, each of the plurality of small holes is formed into a rectangular shape or each of the plurality of small holes is formed into a round shape.

Accordingly, when each of the plurality of small holes formed in series in the lengthwise direction of the rectangular parallelepipedic light emitting portion is rectangular, the hole of the rectangular paralelepipedic light emitting portion is observed easily. Also, when each of the plurality of small holes formed in series in the lengthwise direction of the rectangular parallelepipedic light emitting portion is of a round shape, it is difficult for the electric field of electric power applied to the electrode layer to concentrate in the edge portion of the small hole.

As another embodiment of the invention in the light emitting element as described above, the enclosing portion has a light transmitting property and the electrode layers do not have a light transmitting property. Accordingly, from the opening holes in the electrode layers not having a light transmitting property, the light emitting portion is optically observed by means of an optical microscope or the like through the enclosing portion having a light transmitting property.

As another embodiment of the invention in the light emitting element as described above, the enclosing portion is capable of radiating an electron beam satisfactorily, and the electrode layers do not transmit an electron beam well therethrough. Accordingly, from the opening holes in the electrode layers which do not transmit an electron beam well therethrough, the light emitting portion is observed by an electron beam by means of an electronic microscope or the like through the enclosing portion which is capable of radiating an electron beam satisfactorily.

A method of manufacturing the light emitting element of the present invention is a method of manufacturing the light emitting element comprising forming a first electrode layer on the surface of a base member, forming on the surface of the first electrode layer an enclosing portion having electrical conductivity and having a light emitting portion enclosed therein, and forming a second electrode layer on the surface of the enclosing portion, wherein an opening hole permitting the light emitting portion to be observed through the enclosing portion from a direction which is not affected by a beam emitted from the light emitting portion is formed in the second electrode layer.

Accordingly, in the method of manufacturing the light emitting element of the present invention, an opening hole permitting the light emitting portion to be observed through the enclosing portion is formed in the second electrode layer, and therefore, the light emitting element is formed into such structure that the light emitting portion emitting light can be observed from the outside of the second electrode layer through the opening hole.

A method of manufacturing another light emitting element of the present invention is a method of manufacturing the light emitting element comprising forming a first electrode layer on the surface of a base member having at least electrical conductivity, forming on the surface of the first electrode layer an enclosing portion having electrical conductivity and having a light emitting portion enclosed therein, and forming a second electrode layer on the surface of the enclosing portion, wherein an opening hole permitting the light emitting portion to be observed through the base member and the enclosing portion from a direction which is not affected by a beam emitted from the light emitting portion is formed in the first electrode layer.

Accordingly, in the method of manufacturing the light emitting element of the present invention, an opening hole permitting the light emitting portion to be observed through the base member and the enclosing portion is formed in the first electrode layer and therefore, the light emitting element is formed into such structure that the light emitting portion emitting light can be observed from the outside of the first electrode layer through the opening hole.

As another embodiment of the invention in the method of manufacturing the light emitting element as described above, when the second electrode layer is to be formed on the surface of the enclosing portion, this electrode layer is formed into a shape in which the opening hole is formed. Alternatively, after the second electrode layer is formed on the surface of the enclosing portion, the opening hole is formed in this electrode layer.

Accordingly, when the second electrode layer is to be formed as a shape in which the opening hole is formed, it is unnecessary to form the opening hole after the second electrode layer is formed. Also, when the opening hole is to be formed after the second electrode layer is formed, the opening hole can be formed in a light emitting element formed by the same process as that in the prior art.

As another embodiment of the invention in the method of manufacturing the light emitting element as described above, when the first electrode layer is to be formed on the surface of the base member, this electrode layer is formed into a shape in which the opening hole is formed. Alternatively, after the second electrode layer is formed on the surface of the base member, the opening hole is formed in this electrode layer.

Accordingly, when the first electrode layer is to be formed into a shape in which the opening hole is formed, the opening hole which is difficult to form after the lamination of the enclosing portion, etc., can be formed in the first electrode layer. Also, when the opening hole is to be formed after the second electrode layer is formed on the surface of the base member, the opening hole is formed in an electrode layer formed by a method similar to that according to the prior art.

As another embodiment of the invention in the method of manufacturing the light emitting element as described above, the opening hole is formed into a shape corresponding to the light emitting portion. Accordingly, the opening hole is formed into a shape enabling substantially the entire light emitting portion emitting light to be observed, and the opening hole is not formed unnecessarily large in the electrode layer for supplying electric power.

As an another embodiment of the invention in the method of manufacturing the light emitting element as described above, the light emitting portion is formed into a rectangular parallelepipedic shape emitting a ray of light in the lengthwise direction thereof, and the opening hole is formed into a rectangular parallelepipedic shape. Alternatively, the light emitting portion is formed into a rectangular parallelepipedic shape emitting a ray of light in the lengthwise direction thereof, and said opening hole is formed as a plurality of small holes formed in series in the lengthwise direction of the light emitting portion.

Accordingly, when the opening hole is to be formed into a rectangular parallelepipedic shape, the opening hole is formed into a rectangular parallelepipedic shape permitting substantially the entire rectangular parallelepipedic light emitting portion emitting a ray of light in the lengthwise direction thereof to be observed. Also, when the opening hole is to be formed as a plurality of small holes formed in series in the lengthwise direction of the light emitting portion, the opening hole is formed as a plurality of small holes permitting substantially the entire rectangular parallelepipedic light emitting portion emitting a ray of light in the lengthwise direction thereof to be observed.

As another embodiment of the invention in the method of manufacturing the light emitting element as described above, each of the plurality of small holes is formed into a rectangular shape. Alternatively, each of the plurality of small holes is formed into a round shape.

Accordingly, when each of the plurality of small holes is to be formed into a rectangular shape, each of the plurality of small holes is formed into a rectangular shape permitting the entire rectangular parallelepiped light emitting portion to be observed easily. Also, when each of the plurality of small holes is to be formed into a round shape, each of the plurality of small holes is formed into such a round shape that it is difficult for the electric field of electric power applied to the electrode layers to concentrate in the edge portion.

DESCRIPTION OF THE PREFERRED EMBODIMENTS

A semiconductor laser which is an embodiment of the light emitting element of the present invention will hereinafter be described with reference to FIGS. 3 and 4. However, regarding the semiconductor laser of the present embodiment, the same portions as those of the semiconductor laser previously described as an example of the prior art are given the same names and need not be described in detail.

Figure 1:
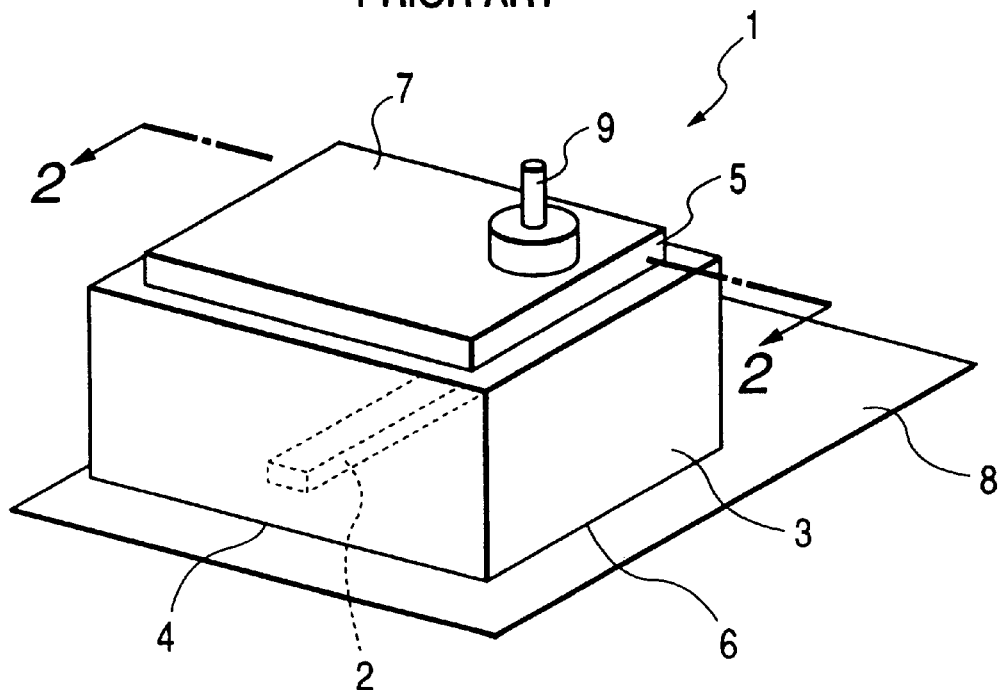
FIG. 1 is a typical perspective view showing the appearances of a semiconductor laser.
Figure 2:
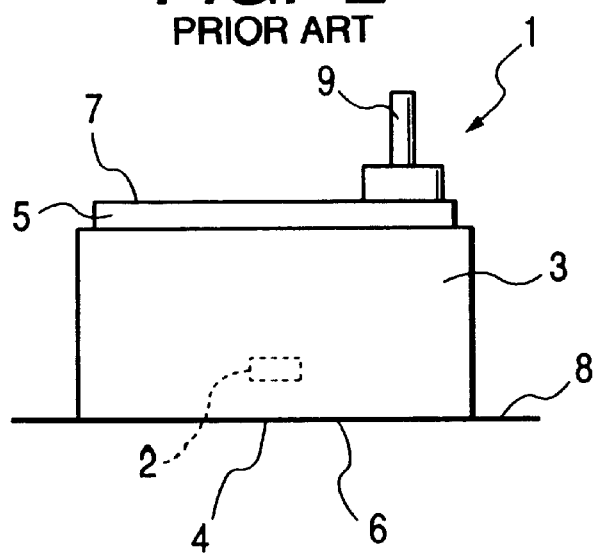
FIG. 2 is a longitudinal cross-sectional view taken along the line 2—2 of FIG. 1.
Figure 3:
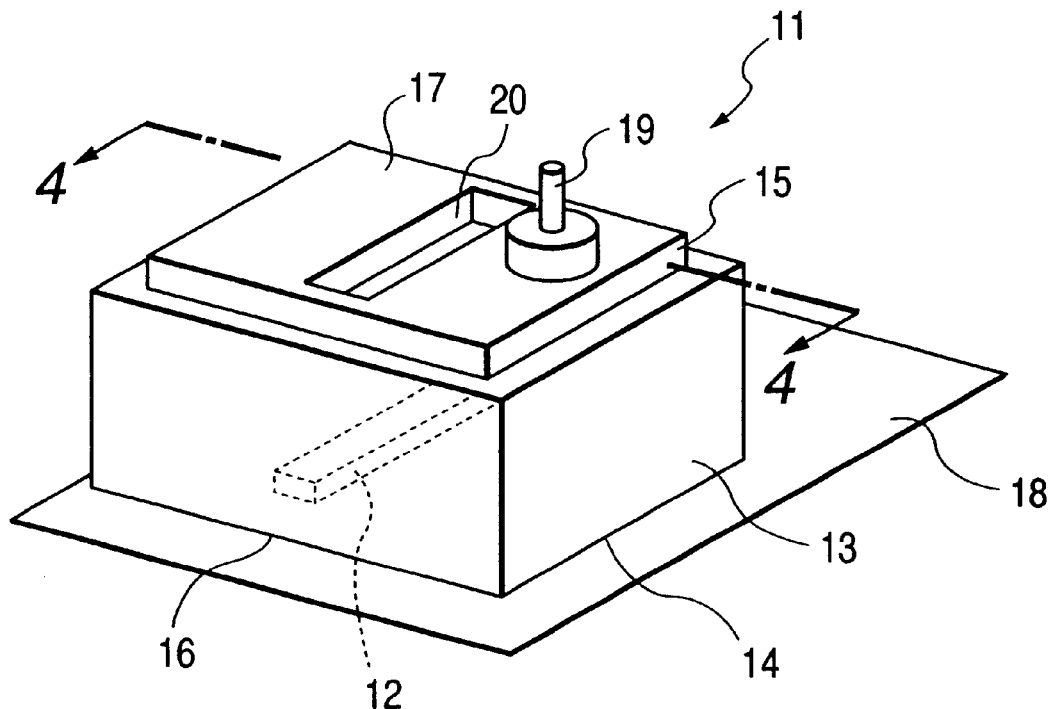
FIG. 3 is a typical perspective view showing the appearances of a semiconductor laser which is an embodiment of the light emitting element of the present invention.
Figure 4:
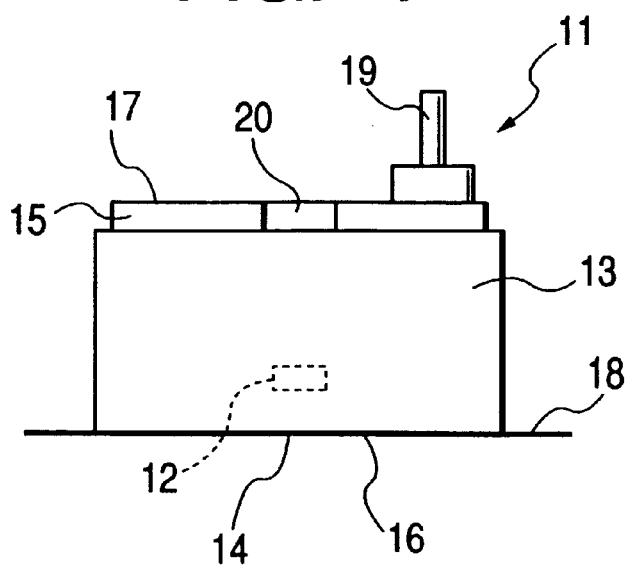
FIG. 4 is a longitudinal cross-sectional view taken along the line 4—4 of FIG. 3.

FIG. 3 is a typical perspective view showing the appearances of a semiconductor laser which is an embodiment of the light emitting element of the present invention, and FIG. 4 is a longitudinal cross-sectional view taken along the line 4—4 of FIG. 3. Also, in the present embodiment, the longitudinal, left to right and vertical directions are referred to with reference to FIG. 3, but these directions are conveniently used to simplify the description and do not restrict the directions during the manufacture and use of the actual semiconductor laser.

A semiconductor laser 11 exemplified as the light emitting element of the present embodiment, like the semiconductor laser 1 previously described as an example of the prior art, is also provided with a laser resonator (stripe) 12 as a rectangular parallelepipedic light emitting portion elongated in the longitudinal direction (front-rear direction) thereof, and this laser resonator (stripe) 12 is enclosed in laser diode chip 13 which is a vertically flat rectangular parallelepipedic enclosing portion.

First and second electrode layers 16 and 17 are formed on a cathode surface 14 and an anode surface 15, respectively, which are the vertically opposed two surfaces of the laser diode chip 13, and the first electrode layer 16 is connected to a stem 18, and the second electrode layer 17 has a bonding wire 19 connected thereto.

Also, in the semiconductor laser 11 of the present embodiment, as in the semiconductor laser 1 previously described as an example of the prior art, the laser resonator (stripe) 12 induces and emits a laser beam in a forward direction orthogonal to a vertical direction in which electric power is supplied. Further, the laser diode chip 13 physically transmits a light beam well and is capable of direct radiation for satisfactorily observing an electron beam, but the first and second electrode layers 16 and 17 do not satisfactorily transmit a visible ray of light or an electron beam therethrough.

However, the semiconductor laser 11 of the present embodiment, unlike the semiconductor laser 1 previously described as an example of the prior art, has an opening hole 20 formed in the second electrode layer 17, and sideways of this opening hole 20, the bonding wire 19 is connected to the second electrode layer 17.

In the semiconductor laser 11 of the present embodiment, the laser resonator (stripe) 12 is formed into a rectangular parallelepipedic shape inducing and emitting a laser beam in the lengthwise direction thereof, and therefore, as a shape corresponding thereto, the opening hole 20 is formed into a rectangular shape continuous in the longitudinal direction thereof. The laser resonator (stripe) 12 is observable from this opening hole 20 through the laser diode chip 13.

A method of manufacturing the semiconductor laser 11 of the present embodiment will hereinafter be described briefly. The first electrode layer 16 is first formed on the surface of an electrically conductive substrate (not shown) which is a base member, and with the laser resonator (stripe) 12, the laser diode chip 13 is formed on the surface of this electrode layer 16 by the lamination of various kinds of film layers. Then, the second electrode layer 17 is laminated on the surface of the laser diode chip 13, and the opening hole 20 is formed in this electrode layer 17 as by photolithography art or the like.

In the semiconductor laser 11 of the present embodiment having the construction as described above, when electric power is supplied to the first and second electrode layers 16 and 17 through the bonding wire and the stem 18, this electric power is supplied to the laser resonator (stripe) 12 through the laser diode chip 13. Therefore, from this laser resonator (stripe) 12, a laser beam is induced and emitted in a forward direction, i.e., in a lengthwise direction.

In this laser resonator (stripe) 12, destruction or abnormality of the crystal may sometimes occur due to external electrical stress or the like, but in the semiconductor laser 11 of the present embodiment, the laser resonator (stripe) 12 emitting light can be dynamically observed from the opening hole 20 in the second electrode layer 17 through the laser diode chip 13.

Therefore, in the semiconductor laser 11 of the present embodiment, the state of the destruction or abnormality of the crystal of the laser resonator (stripe) 12 can be dynamically easily observed. Thus, the cause of any destruction or abnormality can be cleared up, and an effective countermeasure can be taken to thereby contribute to the development of a product of good durability.

Particularly, in the semiconductor laser 11 of the present embodiment, the electrode layers 16 and 17 do not satisfactorily transmit a light beam or an electron beam therethrough, but the laser diode chip 13 enclosing the laser resonator (stripe) 12 therein transmits a light beam well and is capable of direct radiation for satisfactorily observing an electron beam. The laser resonator (stripe) 12 emitting light can be observed well from the opening hole 20 in the electrode layer 17 by means of an optical microscope or an electronic microscope (not shown).

Also, in the semiconductor laser 11 of the present embodiment, the laser resonator (stripe) 12 which is a light emitting portion emits a laser beam in a forward direction orthogonal to the direction of supply of electric power. Therefore, this state can be well observed from above which is a direction not affected by the laser beam through the opening hole 20 in the electrode layer 17.

Further, in the semiconductor laser 11 of the present embodiment, the opening hole 20 in the electrode layer 17 is formed into a rectangular shape corresponding to the rectangular parallelepipedic laser resonator (stripe) 12. Therefore, the entire laser resonator (stripe) 12 can be observed easily. However, an unnecessarily large opening hole 20 is not formed in the electrode layer 17. Therefore, a reduction in the electric power supplying performance by the formation of the opening hole 20 is minimized.

Also, in a method of manufacturing the semiconductor laser 11 of the present embodiment, after the semiconductor laser 11 is manufactured by a method similar to that according to the prior art, the opening hole 20 is formed in the electrode layer 17 thereof. Therefore, the manufacturing process before the last stage is the same as that in the prior art and thus, manufacturing facilities similar to those in the prior art can be used, and the semiconductor laser 11 can also be realized by working, for example, the semiconductor laser 1 according to the prior art.

The present invention is not restricted to the above-described embodiment, but permits various modifications without departing from the spirit of the invention. For example, in the above-described embodiment, it has been exemplified to form an opening hole 20 in the electrode layer of a semiconductor laser 1 manufactured by a method similar to that according to the prior art and complete a semiconductor laser 11.

However, when the second electrode layer 17 is to be formed, for example, on the surface of the laser diode chip 13, it is also possible to form this electrode layer 17 into a shape in which the opening hole 20 is formed. In this case, it is unnecessary to form the opening hole 20 after the second electrode layer 17 is formed. Therefore, any increase in the manufacturing steps can be prevented to thereby improve productivity.

Also, it has been exemplified to form the opening hole 20 in the second electrode layer 17 when manufacturing the semiconductor laser 11 with various kinds of film layers successively laminated on the surface of the electrically conductive substrate, but it is also possible to form the first electrode layer formed with an opening hole on the surface of a substrate having a light transmitting property and thereafter laminate various kinds of film layers thereon to thereby manufacture a semiconductor laser (not shown).

Also, in the above-described embodiment, it has been exemplified that the cathode surface 14 is located on the lower surface of the semiconductor laser 11 and the anode surface 15 is located on the upper surface thereof, but such a structure that these are made converse is also possible. Further, in the above-described embodiment, it has been exemplified that the first electrode layer 16 is connected to the stem 18, but it is also possible to connect a bonding wire thereto.

Figure 5:
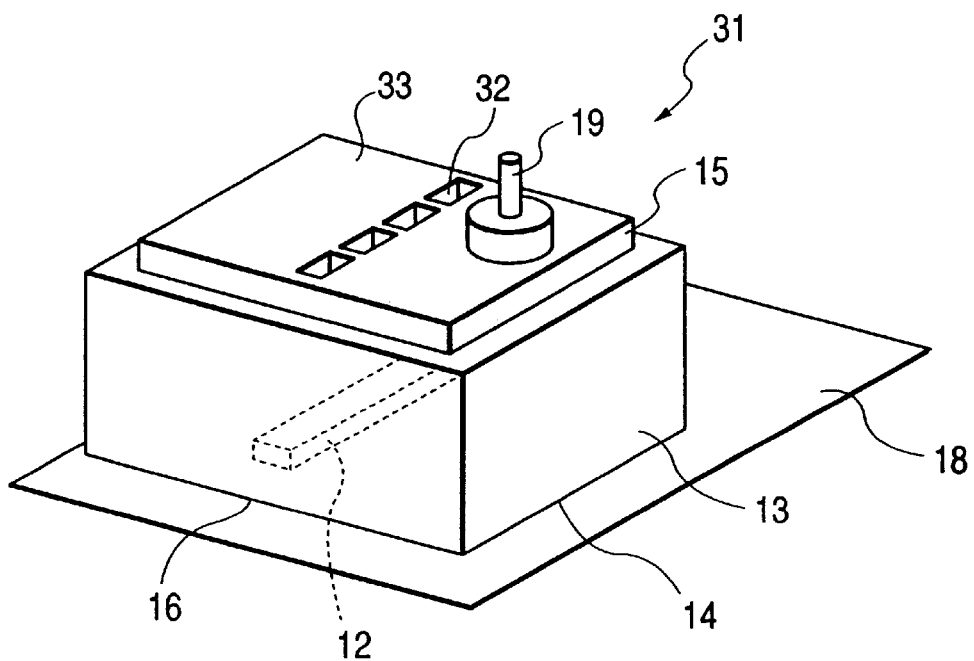
FIG. 5 is a typical perspective view showing the appearances of a semiconductor laser which is a first modification of the light emitting element.

Also, in the above-described embodiment, it has been exemplified that the opening hole 20 is formed into a rectangular shape as a shape corresponding to the rectangular parallelepipedic laser resonator (stripe) 12, but as in a semiconductor laser 31 according to a first modification shown in FIG. 5, it is also possible to form a plurality of rectangular small holes 32 in series in an electrode layer 33 as an opening hole of a shape corresponding to the rectangular parallelepipedic laser resonator (stripe) 12.

In the case of this semiconductor laser 31, substantially the entire rectangular parallelepipedic laser resonator (stripe) 12 can be observed through the plurality of small holes 32 formed in series in the electrode layer 33 in the lengthwise direction thereof, and yet electric power is substantially uniformly supplied from the electrode layer 33 to the anode surface 15 of the laser diode chip 13. Therefore, the supply characteristic of this electric power is good, and the light emitting characteristic of the laser resonator (stripe) 12 is also improved.

Figure 6:
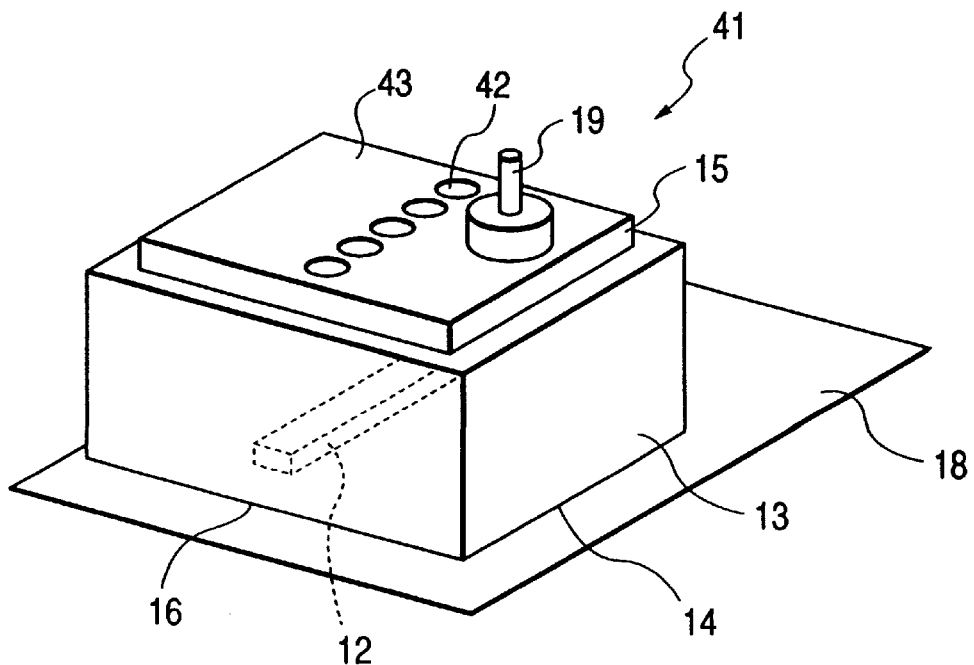
FIG. 6 is a typical perspective view showing the appearances of a semiconductor laser which is a second modification of the light emitting element.

Further, as in a semiconductor laser 41 according to a second modification shown in FIG. 6, it is also possible to form a plurality of round small holes 42 in series in an electrode layer 43 as an opening hole of a shape corresponding to the rectangular parallelepipedic laser resonator (stripe) 12. In the case of this semiconductor laser 41, substantially the entire rectangular parallelepipedic laser resonator (stripe) 12 can be observed through the plurality of small holes 42 formed in series in the electrode layer 43 in the lengthwise direction thereof.

Moreover, electric power is substantially uniformly supplied from the electrode layer 43 to the anode surface 15 of the laser diode chip 13. Therefore, the supply characteristic of this electric power is good, and the light emitting characteristic of the laser resonator (stripe) 12 is also improved. Further, since the opening hole comprises a plurality of small holes 42 formed in series, the concentration of an electric field can be mitigated more than in the case of the aforedescribed plurality of small holes 32.

Although the aforedescribed rectangular opening hole 20 is best in terms of observation, the electrical characteristic is more or less impeded. On the other hand, the plurality of round small holes 42 is best in the electrical characteristic, but observation is more or less impeded. The plurality of rectangular small holes 32 has medium characteristics. That is, the above-described three examples have their own merits and disadvantages. Therefore, it is preferable to choose them with various conditions taken into account.

Further, in the above-described embodiment, the semiconductor laser 11 has been exemplified as the light emitting element, but the present invention can be any semiconductor laser in which electrode layers are formed on the pair of outer surfaces of an enclosing portion enclosing a light emitting portion therein, and is also applicable, for example, to LED (light emitting diode), EL (electro-luminescence), etc.

The present invention is constructed as described above and therefore achieves the effects as described below.

The light emitting element of the present invention is a light emitting element provided with a light emitting portion emitting light by the supply of electric power thereto, an enclosing portion having electrical conductivity and having said light emitting portion enclosed therein, and first and second electrode layers formed on the two opposed surfaces of said enclosing portion and to which electric power for causing said light emitting portion to emit light is supplied, at least one of said first and second electrode layers being formed with an opening hole permitting said light emitting portion to be observed through said enclosing portion from a direction which is not affected by a beam emitted from said light emitting portion, whereby the light emitting portion emitting light can be dynamically observed from the outside of said opening hole.

Also, in the light emitting element of the present invention, said light emitting portion comprises a laser resonator (stripe) for inducing and emitting a laser beam in a direction orthogonal to a direction in which the electric power is supplied, whereby a state in which the laser resonator (stripe) emits the laser beam can be observed from a direction orthogonal thereto.

Also, in the light emitting element of the present invention, the opening hole in said electrode layer is formed into a shape corresponding to said light emitting portion. Therefore, substantially the entire light emitting portion emitting light can be observed from the opening hole in the electrode layer, and yet the opening hole is not formed unnecessarily large. Therefore, electric power can be supplied well.

Also, in the light emitting element of the present invention, said light emitting portion is formed into a rectangular parallelepipedic shape emitting a ray of light in the lengthwise direction thereof, and said opening hole is formed into a rectangular shape, whereby substantially the entire rectangular parallelepipedic light emitting portion emitting the ray of light in the lengthwise direction can be observed from the opening hole formed in the rectangular shape.

Also, in the light emitting element of the present invention, said light emitting portion is formed into a rectangular parallelepipedic shape emitting a ray of light in the lengthwise direction thereof, and said opening hole comprises a plurality of small holes formed in series in the lengthwise direction of said light emitting portion, whereby substantially the entire rectangular parallelepipedic light emitting portion emitting the ray of light in the lengthwise direction thereof can be observed from the plurality of small holes formed in series in the lengthwise direction thereof, and yet electric power can be substantially uniformly supplied from the electrode layers to the enclosing portion.

Also, in the light emitting element of the present invention, each of said plurality of small holes is formed into a rectangular shape, whereby even if the opening hole comprises a plurality of small holes, the whole of the rectangular parallelepipedic light emitting portion can be observed easily.

Also, in the light emitting element of the present invention, each of said plurality of small holes is formed into a round shape, whereby concentration of the electric field of the electric power applied to the electrode layers in the edge portions of the small holes can be mitigated.

Also, in the light emitting element of the present invention, said enclosing portion is capable of radiating an electron beam satisfactorily and said electrode layers do not have a light transmitting property, whereby from the opening hole in the electrode layer not having the light transmitting property, the light emitting portion can be optically observed well by means of an optical microscope or the like through the enclosing portion which is capable of radiating an electron beam satisfactorily.

Also, in the light emitting element of the present invention, said enclosing portion transmits an electron beam well therethrough and said electrode layers do not satisfactorily transmit an electron beam therethrough, whereby from the opening hole in the electrode layer which does not satisfactorily transmit the electron beam therethrough, the light emitting portion can be observed well through the enclosing portion which satisfactorily transmits the electron beam therethrough by means of an electronic microscope or the like with the aid of the electron beam.

Also, the method of manufacturing the light emitting element of the present invention is a method of manufacturing the light emitting element comprising forming a first electrode layer on the surface of a base member, forming on the surface of said first electrode layer an enclosing portion having electrical conductivity and having a light emitting portion enclosed therein, and forming a second electrode layer on the surface of said enclosing portion, wherein an opening hole permitting said light emitting portion to be observed through said enclosing portion from a direction which is not affected by a beam emitted from said light emitting portion is formed in said second electrode layer, whereby the light emitting element can be formed into such a structure that from the outside of the second electrode layer, the light emitting portion emitting light can be observed through the opening hole from the direction which is not affected by the beam emitted from said light emitting portion.

Also, the method of manufacturing the light emitting element of the present invention is a method of manufacturing the light emitting element comprising forming a first electrode layer on the surface of a base member having at least electrical conductivity, forming on the surface of said first electrode layer an enclosing portion having electrical conductivity and having a light emitting portion enclosed therein, and forming a second electrode layer on the surface of said enclosing portion, wherein an opening hole permitting said light emitting portion to be observed through said base member and said enclosing portion from a direction which is not affected by a beam emitted from said light emitting portion is formed in said first electrode layer, whereby the light emitting element can be formed into such a structure that from the outside of the first electrode layer, the light emitting portion emitting light can be observed through the opening hole from the direction which is not affected by the beam emitted from said light emitting portion.

Also, in the method of manufacturing the light emitting element of the present invention, when said second electrode layer is to be formed on the surface of said enclosing portion, this electrode layer is formed into a shape in which said opening hole is formed, whereby it is unnecessary to form the opening hole after the second electrode layer is formed and therefore, any increase in the manufacturing steps can be prevented to thereby improve productivity.

Also, in the method of manufacturing the light emitting element of the present invention, after said second electrode layer is formed on the surface of said enclosing portion, said opening hole is formed in this electrode layer, whereby the opening hole can be formed in a light emitting element formed by the same process as that in the prior art. Therefore, the prior art manufacturing facilities can be utilized.

Also, in the method of manufacturing the light emitting element of the present invention, when said first electrode layer is to be formed on the surface of said base member, this electrode layer is formed into a shape in which said opening hole is formed, whereby it is unnecessary to form the opening hole after the first electrode layer is formed. Therefore, any increase in the manufacturing steps can be prevented to thereby improve productivity.

Also, in the method of manufacturing the light emitting element of the present invention, after said second electrode layer is formed on the surface of said base member, said opening hole is formed in this electrode layer, whereby the opening hole can be formed in an electrode layer formed by a method similar to that according to the prior art.

Also, in the method of manufacturing the light emitting element of the present invention, said opening hole is formed into a shape corresponding to said light emitting portion, whereby the opening hole can be formed into a shape enabling substantially the entire light emitting portion emitting light to be observed, and yet the opening hole is not formed unneccessarily large in the electrode layer for supplying electric power.

Also, in the method of manufacturing the light emitting element of the present invention, said light emitting portion is formed into a rectangular parallelepipedic shape emitting a ray of light in the lengthwise direction thereof, and said opening hole is formed into a rectangular shape, whereby the opening hole can be formed into a rectangular shape enabling substantially the entire rectangular parallelepipedic light emitting portion emitting the ray of light in the lengthwise direction thereof to be observed.

Also, in the method of manufacturing the light emitting element of the present invention, said light emitting portion is formed into a rectangular parallelepipedic shape emitting a ray of light in the lengthwise direction thereof, and said opening hole is formed as a plurality of small holes formed in series in the lengthwise direction of said light emitting portion, whereby the opening hole can be formed as a plurality of small holes permitting substantially the entire rectangular parallelepipedic light emitting portion emitting the ray of light in the lengthwise direction thereof to be observed.

Also, in the method of manufacturing the light emitting element of the present invention, each of said plurality of small holes is formed into a rectangular shape, whereby each of the plurality of small holes can be formed into a rectangular shape permitting the entire rectangular parallelepipedic light emitting portion to be observed easily.

Also, in the method of manufacturing the light emitting element of the present invention, each of said plurality of small holes is formed into a round shape, whereby each of the plurality of small holes can be formed into a round shape in which it is difficult for the electric field of electric power applied to the electrode layers to concentrate in the edge portion.

What is claimed is:

1. A light emitting element comprising:
   a stripe-shaped laser resonator extending in a lengthwise direction of resonance, said laser resonator emitting light when electric power is supplied thereto;
   an enclosing portion enclosing said laser resonator therein, said enclosing portion having electrical conductivity and having two opposed surfaces;
   first and second electrode layers for supplying electric power to said laser resonator, said first and second electrode layers being formed, respectively, on one and the other of the two opposed surfaces of said enclosing portion; and
   an opening portion formed in at least one of said first and second electrode layers, said opening portion comprising an oblong hole extending in the lengthwise direction of said laser resonator or a plurality of small holes formed in series in the lengthwise direction of said laser resonator for permitting said laser resonator to be observed through said enclosing portion.

2. The light emitting element according to claim 1, wherein said opening portion comprises a plurality of small holes formed in series in the lengthwise direction of said laser resonator, each of said plurality of small holes being rectangular in shape.

3. The light emitting element according to claim 1, wherein said opening portion comprises a plurality of small holes formed in series in the lengthwise direction of said laser resonator, each of said plurality of small holes being circular in shape.

4. The light emitting element according to claim 1, wherein said enclosing portion transmits light emitted at said laser resonator, and said first and second electrode layers do not transmit light emitted at said laser resonator.

5. The light emitting element according to claim 1, wherein said enclosing portion transmits an electron beam, and said first and second electrode layers do not transmit an electron beam.

* * * * *